(12) United States Patent
Berry et al.

(10) Patent No.: US 11,914,355 B2
(45) Date of Patent: Feb. 27, 2024

(54) SYSTEM FOR DETERMINING ELECTRIC PARAMETERS OF AN ELECTRIC POWER GRID

(71) Applicant: REACTIVE TECHNOLOGIES LIMITED, Oxford (GB)

(72) Inventors: Brian Berry, Edinburgh (GB); Mika Ventola, Oulu (FI); Daniel Gheorghe, Glasgow (GB); Timo Peltola, Lohja (FI); Jukka Alakontiola, Oulu (FI)

(73) Assignee: Reactive Technologies Limited, Oxford (GB)

( * ) Notice: Subject to any disclaimer, the term of this patent is extended or adjusted under 35 U.S.C. 154(b) by 66 days.

(21) Appl. No.: 17/533,443

(22) Filed: Nov. 23, 2021

(65) Prior Publication Data

US 2022/0083037 A1    Mar. 17, 2022

Related U.S. Application Data

(63) Continuation of application No. 16/733,644, filed on Jan. 3, 2020, now Pat. No. 11,215,979.

(30) Foreign Application Priority Data

Jun. 25, 2019 (EP) .................................... 19182247

(51) Int. Cl.
   *G05B 23/02* (2006.01)
   *G06F 1/28* (2006.01)

(52) U.S. Cl.
   CPC ........... *G05B 23/0213* (2013.01); *G06F 1/28* (2013.01)

(58) Field of Classification Search
   None
   See application file for complete search history.

(56) References Cited

U.S. PATENT DOCUMENTS 5,602,709 A * 2/1997 Al-Dabbagh ........ H02H 1/0015
                                                            324/520
2006/0217936 A1    9/2006 Mason
(Continued)

FOREIGN PATENT DOCUMENTS

GB          1 460 347         1/1977
JP      H01(1989)-099435      4/1989
(Continued)

OTHER PUBLICATIONS

Search Report for EP19182247.7 dated Nov. 29, 2019, 5 pages.
(Continued)

*Primary Examiner* — Nathan L Laughlin
(74) *Attorney, Agent, or Firm* — Nixon & Vanderhye PC

(57) ABSTRACT

This document discloses a solution for a method of monitoring an electric power grid. According to an aspect, a method comprises: obtaining, on a basis of one or more physical stimuli generated endogenously in the electric power grid, a first set of measurement data associated with a first location of the electric power grid, the physical stimuli belonging to nominal or near-nominal operation of the electric power grid and generating at least one of voltage fluctuation and current fluctuation that exceeds at least one threshold; computing a grid strength of the first location of the electric power grid on the basis of the first set of measurement data; mapping the grid strength to a grid strength of a second location of the electric power grid on the basis of the first set of measurement data and correlation between electrical characteristics of the first location and the second location.

20 Claims, 8 Drawing Sheets

(56) References Cited

U.S. PATENT DOCUMENTS

| | | |
|---|---|---|
| 2012/0022713 A1 | 1/2012 | Deaver et al. |
| 2016/0274175 A1 | 9/2016 | Outram |
| 2017/0133834 A1 | 5/2017 | Blug |
| 2018/0210976 A1 | 7/2018 | Goyal et al. |
| 2019/0131795 A1 | 5/2019 | Gadiraju et al. |
| 2019/0245342 A1 | 8/2019 | Sharon |
| 2019/0271731 A1 | 9/2019 | Miron |
| 2020/0012500 A1 | 1/2020 | Kern |
| 2020/0403406 A1* | 12/2020 | Shafiullah ................ G06N 3/04 |
| 2020/0409347 A1 | 12/2020 | Berry et al. |
| 2023/0024645 A1* | 1/2023 | Hao ....................... G06N 20/00 |

FOREIGN PATENT DOCUMENTS

| | | |
|---|---|---|
| JP | H04(1992)-091623 | 3/1992 |
| JP | H10(1998)-248168 | 9/1998 |
| JP | H10(1998)-271686 | 10/1998 |
| JP | 2001-086644 | 3/2001 |
| JP | 2012-163384 | 8/2012 |
| WO | 2015/172810 | 11/2015 |

OTHER PUBLICATIONS

Combined Search and Examination Report for GB1909093.5 dated Aug. 19, 2019, 5 pages.
A. Merlinda et al., "Game-theoretic modeling of curtailment rules and network investments with distributed generation", *Applied Energy*, vol. 201, May 22, 2017, pp. 174-187.
Dec. 27, 2022 Office Action issued in Japanese Patent Application No. 2021-576297, pp. 1-2 [machine translation provided].

* cited by examiner

SYSTEM FOR DETERMINING ELECTRIC PARAMETERS OF AN ELECTRIC POWER GRID

CROSS-REFERENCES TO RELATED APPLICATIONS

This application is a continuation of U.S. application Ser. No. 16/733,644 filed Jan. 3, 2020, which claims priority to EP Patent Application No. 19182247.7 filed Jun. 25, 2019, the entire content of each of which are hereby incorporated by reference.

TECHNICAL FIELD

The invention relates to measurement-based analysis of an electric power grid and, particularly, to estimating electric parameters of the electric power grid.

TECHNICAL BACKGROUND

Since the standardisation of the frequency of alternating current (AC) electricity in large scale electric power grids in the mid-20th century around the globe, consumers of electricity have been able to enjoy a consistent and dependable service of electricity, ensuring safe and reproducible use of electrical appliances. Provision of such a reliable service may include monitoring the characteristics of an electric power grid and taking measures to anomalies detected in the grid. Such characteristics that may be monitored include grid frequency, fault level, reactive power, heat, losses, constraints, noise, and/or impedance at various locations of the grid.

BRIEF DESCRIPTION

The invention is defined by the independent claims. Embodiments are defined in the dependent claims.

According to an aspect, there is provided a method for monitoring an electric power grid, the method comprising: detecting one or more physical stimuli generated endogenously in the electric power grid, the physical stimuli belonging to nominal or near-nominal operation of the electric power grid and generating at least one of voltage fluctuation and current fluctuation that exceeds at least one threshold; obtaining, while the one or more physical stimuli is effective, a first set of measurement data associated with a first location of the electric power grid; computing a grid strength of the first location of the electric power grid on the basis of the first set of measurement data; mapping the grid strength to a grid strength of a second location of the electric power grid on the basis of the first set of measurement data and correlation between electrical characteristics of the first location and the second location.

In an embodiment, measurement data from the second location is at least currently unavailable.

In an embodiment, the grid strength of the first location is computed by computing a source impedance at the first location on the basis of a voltage and a current measured at the first location before a physical stimulus of the one or more physical stimuli and a voltage and a current measured at the first location after the physical stimulus.

In an embodiment, the first location is at a first voltage level and the second location is at a second voltage level different from the first voltage level.

In an embodiment, the first location and the second location are both located on the same voltage level of the electric power grid.

In an embodiment, the method further comprises forming, by using machine learning, the correlation by using, as training data, the first set of measurement data and at least a second set of measurement data associated with a second location of the electric power grid, the second set of measurement data measured while the one or more physical stimuli is effective, said machine learning further using, when forming the correlation, static internal parameters of the electric power grid and parameters external to the electric power grid.

In an embodiment, the static internal parameters of the electric power grid comprise the electric characteristics of the electric power grid between the first location and the second location.

In an embodiment, the method further comprises verifying the computed electric parameter of at least one of the first location and the second location by using a further set of measurement data measured, upon detecting a further physical stimulus generated on the electric power grid, at a further location different from the first location and the second location.

In an embodiment, the method further comprises: computing a correlation model representing the correlation between the electrical characteristics of the first location and the second location; determining before computing the correlation model, whether if not a sufficient amount of measurement data from at least a determined number of different measurement devices has been obtained; if the sufficient amount of measurement data is not available, waiting for further measurement data before computing the correlation model; and if the sufficient amount of measurement data is available, triggering said computation of the correlation model.

In an embodiment, the method further comprises: determining whether or not the one or more physical stimuli are proximal to a location of a measurement device providing the first set of measurement data, upon determining that the one or more physical stimuli are proximal to the location of the measurement device, causing said obtaining the first set of measurement data, and upon determining that the one or more physical stimuli are not proximal to the location of the measurement device, measurements by the measurement device are not triggered.

In an embodiment, said determining is performed by analyzing a waveform of a signal acquired from the electric power grid and comprising the one or more physical stimuli.

In an embodiment, the method further comprises: obtaining at least a second set of measurement data measured at a different time instant than the first set of measurement data; arranging the correlation model to represent temporal behavior of the grid strength in the electric power grid; and estimating future behavior of the grid strength by using the correlation model.

According to an aspect, there is provided a system for monitoring a grid strength of an electric power grid, the system comprising: an apparatus comprising at least one processor and at least one memory including computer program code, the at least one memory and computer program code configured to, with the at least one processor, cause the apparatus to: obtain, on the basis of one or more physical stimuli generated endogenously in the electric power grid, a first set of measurement data associated with a first location of the electric power grid, the physical stimuli belonging to nominal or near-nominal operation of the electric power grid and generating at least one of voltage fluctuation and current fluctuation that exceeds at least one threshold; compute a grid strength of the first location of the electric power grid on the basis of the first set of measurement data; and map the grid strength to a grid strength of a second location of the electric power grid on the basis of the first set of measurement data and correlation between electrical characteristics of the first location and the second location.

In an embodiment, the system further comprises: a first measurement device at the first location and configured to measure the first set of measurement data on a first voltage level of the electric power grid; and at least a second measurement device, at the second location or at a third location, on a second voltage level of the electric power grid different from the first voltage level and configured to provide further measurement data for the mapping.

In an embodiment, said at least the second measurement device is at the third location, and wherein the at least one memory and computer program code configured to, with the at least one processor, cause the apparatus to compute the grid strength of the second location on the basis of the first set of measurement data measured by the first measurement device and the further measurement data provided by said at least the second measurement device.

According to an aspect, there is provided a computer program product embodied on a non-transitory distribution medium readable by a computer and comprising computer program instructions that, when executed by the computer cause execution of a computer process comprising: obtaining, on a basis of one or more physical stimuli generated endogenously in the electric power grid, a first set of measurement data associated with a first location of the electric power grid, the physical stimuli belonging to nominal or near-nominal operation of the electric power grid and generating at least one of voltage fluctuation and current fluctuation that exceeds at least one threshold; computing a grid strength of the first location of the electric power grid on the basis of the first set of measurement data; mapping the grid strength to a grid strength of a second location of the electric power grid on the basis of the first set of measurement data and correlation between electrical characteristics of the first location and the second location.

BRIEF DESCRIPTION OF THE DRAWINGS

In the following the invention will be described in greater detail by means of preferred embodiments with reference to the accompanying drawings, in which.

DETAILED DESCRIPTION OF EMBODIMENTS

The following embodiments are exemplary. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

Figure 1:
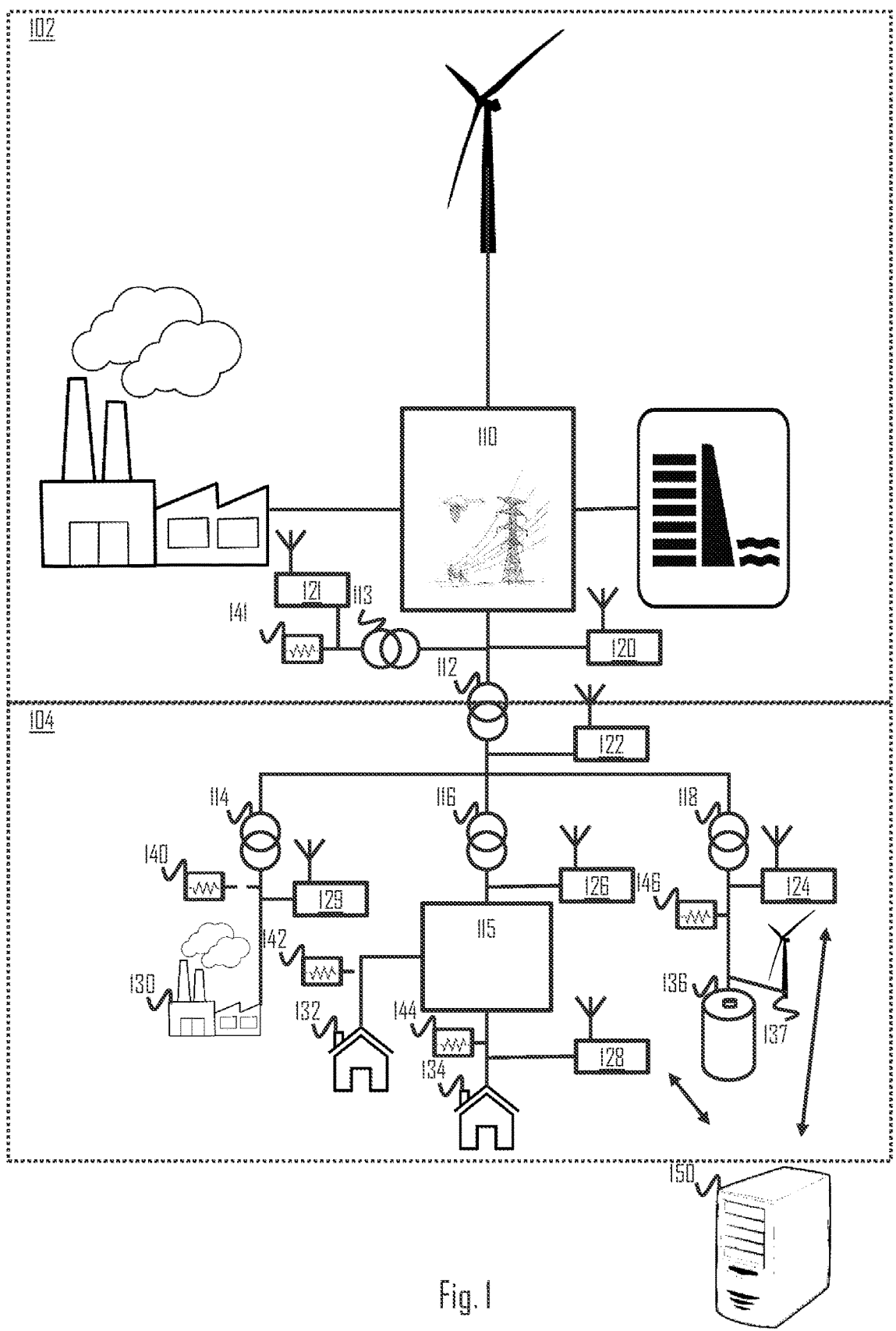
FIG. 1 illustrates an example of an electric power grid to which embodiments of the invention may be applied.

Supply of electricity from providers such as power stations, to consumers, such as domestic households, offices, industry, etc. typically takes place via an electricity distribution network or electric power grid. FIG. 1 shows an exemplary electric power grid, in which embodiments of the present invention may be implemented, comprising a transmission grid 102 and a distribution grid 104.

The transmission grid 102 is connected to power generators, which may be power plants such as nuclear plants, hydroelectric power plants, wind generators or gas-fired plants, for example, from which it transmits large quantities of electrical energy at very high voltages (typically of the order of hundreds of kilovolts, kV), over power lines such as overhead power lines 110, to the distribution grid 104.

The transmission grid 102 is linked to the distribution grid 104 via a transformer 112, which converts the electric supply to a lower voltage, typically of the order of 50 kV, for distribution in the distribution grid 104.

The distribution grid 104 is connected via substations 114, 116, 118 comprising further transformers for converting to still lower voltages to local networks which provide electric power to power consuming devices connected to the electric power grid. The local networks may include networks of domestic consumers, such as a city network 115 that supplies power to domestic appliances within private residences 132, 134 that draw a relatively small amount of power in the order of a few kW. The private residences may also use photovoltaic devices or other power generators to provide relatively small amounts of power for consumption either by appliances at the residence or for provision of power to the grid. The local networks may also include industrial premises such as a factory 130, in which larger appliances operating in the industrial premises draw larger amounts of power in the order of several kW to MWs. The local networks may also include networks of smaller power generators such as wind farms that provide power to the electric power grid. The local networks may further comprise energy storage devices 136 to store electric power locally. Such storage devices 136 may be used to compensate for a difference between supply and demand of electric power.

Although, for conciseness, only one transmission grid 102 and one distribution grid 104 are illustrated in FIG. 1, in practice a typical transmission grid 102 supplies power to multiple distribution grids 104 and one transmission grid 102 may also be interconnected to one or more other transmission grids 102.

Electric power flows in the electric power grid as alternating current (AC), which flows at a system frequency, which may also be referred to as a grid frequency (typically in the range of 50 or 60 Hz, depending on the country). The electric power grid operates at a synchronized frequency so that the frequency is substantially the same at each point of the grid. The electric power grid may include one or more direct current (DC) interconnects (not shown) that provide a DC connection between the electric power grid and other electric power grids. Typically, the DC interconnects connect to the high voltage transmission grid 102 of the electrical power grid. The DC interconnects provide a DC link between the various electric power grids, such that the electric power grid defines an area which operates at a given, synchronised, grid frequency that is not affected by changes in the grid frequency of other electric power grids. For example, the UK transmission grid is connected to the Synchronous Grid of Continental Europe via DC interconnects.

The electric power grid 100 also includes a measurement system in the form of measurement devices 120 to 129 arranged to measure the electric power grid. The measurement devices 120 to 129 may be configured to measure one or more electric parameters of the electric power grid. At least some of the measurement devices 120 to 129 may be coupled to the distribution grid 104, such as the measurement devices 122 to 129, but some of the measurement devices 120, 121 may be coupled to the transmission grid. The measurement device 120 is coupled directly to a high-voltage bus while the measurement device 121 is coupled to a lower-voltage-level bus of the transmission grid 102. A separate transformer 113 may be provided to transform the higher voltage level to the lower voltage level. As illustrated in FIG. 1, the measurement devices may be coupled to various locations at various voltage levels of the electric power grid. For example, the measurement device 120 coupled to the transmission grid 102 may be configured to perform measurements at the very high voltage level of the transmission grid, e.g. 132 kV. The measurement device 122 may be coupled to the distribution grid to perform measurement at a lower voltage level, e.g. 11 or 33 kV. The measurement devices 124 to 129 may be coupled to the distribution grid at a still lower voltage level or levels such as 220 V, 400 V, and/or 11 kV. The voltage level at the measurement device 121 may also be the still lower voltage level such as 220 V, 400 V, or 11 kV. The reader is reminded that the actual voltage levels are merely exemplary, and different electric power grids may employ different voltage levels.

Although, for the sake of simplicity, only a few measurement devices are illustrated in FIG. 1, it will be understood that, in practice, a higher number of such measurement devices may be coupled to the electric power grid, at various voltage levels and/or at various locations such as at different sub-stations or subnetworks of the electric power grid. It should also be appreciated that some embodiments may employ the measurement devices on only a subset of the voltage levels of the electric power grid or the distribution network 104, as described in connection with the embodiments below.

The electric parameter(s) measured by the measurement devices 120 to 129 may include at least one of the following: a voltage (instantaneous or continuous), a current (instantaneous or continuous), a grid frequency, a phasor, a phase angle, reactive power, synchronous oscillations voltage and/or current magnitude, voltage and/or current phase. A time stamp may be provided in connection with each measurement. In some embodiments, the measurement devices are configured to process the measurement data into a higher-level measurement data. For example, the measured voltage and current may be used to compute a fault level at the location of the measurement device. The fault level at a location may be defined as a maximum current that would flow in case of a short circuit fault at that location. In some literature, the fault level is known as short circuit capacity or grid strength. The fault level may be measured from effects of voltage fluctuations in the electric power grid, e.g. by using a concept of Thevenin equivalents. Upon detecting a voltage fluctuation in the electric power grid, a source impedance at the measurement location may be computed by using the following Equation:

$$\vec{Z}_{FL} = -\frac{\Delta \vec{V}}{\Delta \vec{I}} = -\frac{\vec{V}_{post} - \vec{V}_{pre}}{\vec{I}_{post} - \vec{I}_{pre}}$$

where $Z_{FL}$ is the source impedance, $\vec{V}_{pre}$ and $\vec{I}_{pre}$ are voltage and current phasor measurements before a stimulus causing the voltage fluctuation, respectively, and $\vec{V}_{post}$ and $\vec{I}_{post}$ are voltage and current phasor measurements after the stimulus, respectively. The fault level $S_{FL}$ may then be computed by using the following Equation:

$$\vec{S}_{FL\ actual} = \frac{\vec{V}_{actual}^2}{\vec{Z}_{FL}}$$

where $Z_{FL}$ is the source impedance calculated during the event, $\vec{V}_{actual}$ is the voltage measured at the observation time which could be before or after the event depending on which fault level is of most interest.

Below, some embodiments of the stimulus are described.

In order to carry out the measurements, the measurement devices 120 to 129 may each comprise a voltage detector arranged to sample the measured voltage and an analogue to digital converter arranged to convert the sampled voltage to a digital voltage signal. The measurement devices 120 to 129 may each also comprise a current detector arranged to sample the current, and the analogue to digital converter may be arranged to convert the sampled current to a digital current signal. The digital voltage signal and the digital current signal may then be forwarded to the processing system 150 for processing or be processed locally at the respective measurement device. The measurement devices 120 to 129 may each comprise one or both of the voltage detector and the current detector. When a sampling interval is sufficient, the grid frequency may be computed from the measured voltage and/or current.

In some embodiments, at least some of the measurement devices 120 to 129 comprise processing means, for example, in the form a processor, and the processor of the measurement device 120 to 129 may be arranged to determine an electric parameter relating to the measured voltage and/or current. This may be advantageous in that it may reduce the amount of information needing to be communicated by the measurement device 120 to 129 to the processing system, and also that it may reduce the burden placed on the processing system 150.

The physical stimulus may be generated in the electric power grid endogenously, i.e. it may belong to nominal or near-nominal operation of the electric power grid. Alternatively, the physical stimulus may be intentionally generated. FIG. 1 illustrates multiple devices 140 to 146 that are coupled to the electric power grid with a dashed line. The dashed line refers to the capability of connecting and disconnecting the devices 140 to 146 to and from the electric power grid or, more generally, to capability of changing power consumption and/or power supply of the devices 140 to 146 with respect to the electric power grid. The devices 140 to 146 may comprise one or more load banks that, when connected to the electric power grid, cause a change in the impedance of the electric power grid and, thus, voltage and current fluctuation. Instead of, or in addition to the load banks, other devices having similar characteristics may be employed, e.g. capacitors or generators. Examples of the endogenous stimuli include changes in the load of the electric power grid, e.g. a change in a power consumption of the factory 130 or a change in a power supply. The changes may be a part of normal operation of the electric power grid, i.e. there is no need for an abnormal malfunction or a major power outage for measuring the fault level.

The measurement devices may be configured to report the measurement data to a processing system 150. The processing system 150 may be configured to analyse the measurement data and, in some embodiments, perform some control of the electric power grid on the basis of the analysis. Detailed embodiments are described below. The processing system may comprise a processing circuitry in the form of one or more computers. The processing system may include a local network server, a remote server, a cloud-based server, or any other means for carrying out the analysis of the measurement data. The processing system may form a virtual network for carrying out the analysis. In general, virtual networking may involve a process of combining hardware and software network resources and network functionality into a single, software-based administrative entity, a virtual network. Network virtualization may involve platform virtualization, often combined with resource virtualization. Network virtualization may be categorized as external virtual networking which combines many networks, or parts of networks, into a server computer or a host computer. A virtual network may provide flexible distribution of operations between various processing units for performing the analysis.

As illustrated in FIG. 1, the measurement devices may be distributed at various locations of the electric power grid. Typically, the size of the electric power grids is quite large and it is not possible to provide the measurement device at every location or every sub-network of the electric power grid. This generates uncertainty or lack of visibility related to those locations where the measurements are not performed. It would be advantageous to have a big picture of the whole electric power grid or a part of the whole electric power grid, e.g. the distribution network, with a limited number of measurement devices. In other words, it would be advantageous to have a wide real-time view of how the distribution network is performing over time and/or where weaknesses and/or constraints exist.

Figure 2:
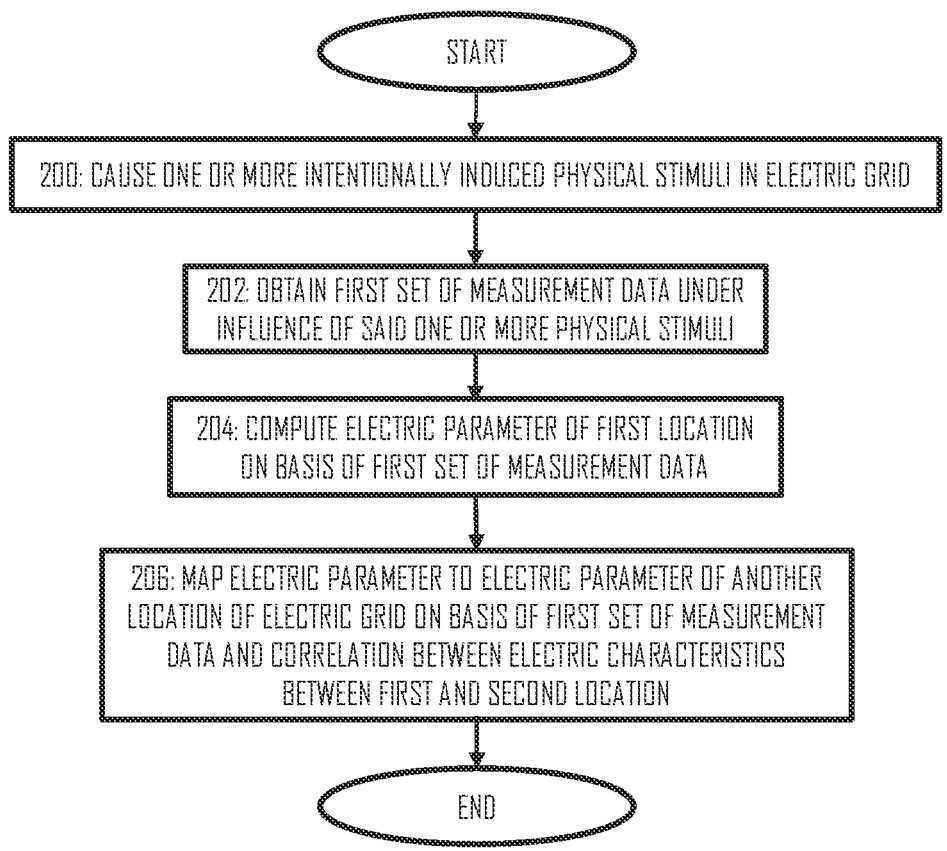
FIGS. 2 and 3 illustrate flow diagrams of processes for estimating an electric parameter of the electric power grid on the basis of measurements according to some embodiments of the invention.

FIG. 2 illustrates a flow diagram of a method for measuring an electric parameter of the electric power grid. Referring to FIG. 2, the method comprises: detecting (block 200) one or more physical stimuli in the electric power grid; obtaining (block 202), while the one or more physical stimuli is effective, a first set of measurement data associated with a first location of the electric power grid; computing (block 204) an electric parameter of the first location of the electric power grid on the basis of the first set of measurement data; and mapping (block 206) the electric parameter to an electric parameter of another location of the electric power grid on the basis of the first set of measurement data and correlation between electrical characteristics of the first location and the second location.

In an embodiment, the one or more physical stimuli comprises at least one intentionally generated stimulus performed by one or more of the devices 140 to 146 whose power supply and/or power consumption with respect to the electric power grid is controlled. In such an embodiment, block 200 may be preceded by a step of causing the one or more intentionally generated stimuli that is performed by a device that controls or triggers the power supply and/or consumption of the device(s) 140 to 146. Such a device may be a measurement controller that controls or schedules the measurements in the system. Such a device may output a control signal to the device(s) 140 to 146 to cause the (dis)connection. Block 200 comprises one or more measurement device 120 to 129 detecting the one or more physical stimuli.

In another embodiment, the one or more physical stimuli comprises at least one stimulus that is endogenous to the electric power grid. In such an embodiment, block 200 comprises one or more measurement device 120 to 129 detecting the one or more endogenous physical stimuli.

In an embodiment, block 202 is performed by one or more of the measurement devices 120 to 129 by measuring the first set of measurement data.

In an embodiment, block 204 is performed by the processing system 150. In another embodiment, block 204 is performed by the measurement device(s) that measured the first set of measurement data. In another embodiment, block 204 is distributed between the measurement device(s) and the processing system.

In an embodiment, block 206 is performed by the processing system.

From the perspective of the processing system, the process comprises blocks 202 to 204 according to an embodiment. The processing system may obtain the first set of measurement data from one or more measurement devices (block 202) and compute the electric parameter in block 204. This process may be executed as a computer-implemented process defined by one or more computer program products comprising a computer program code defining the specifications of the computer-implemented process.

Figure 3:
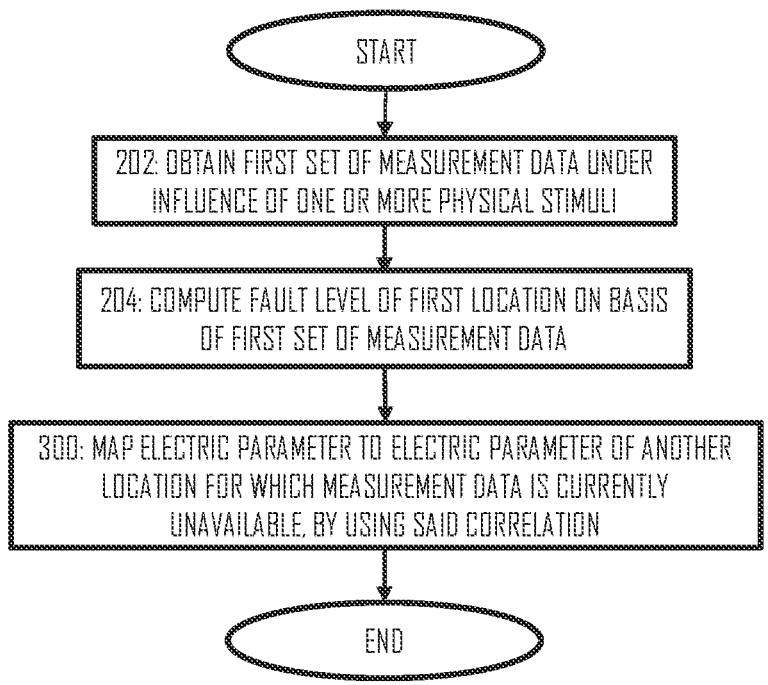

With reference to FIG. 3, a further embodiment of the process executed by the processing system is described. This process may also be executed as a computer-implemented process. The process comprises obtaining (block 202), on a basis of the one or more physical stimuli in the electric power grid, a first set of measurement data associated with a first location of the electric power grid; computing (block 204) an electric parameter of the first location of the electric power grid on the basis of the first set of measurement data; and mapping the electric parameter to an electric parameter of another location of the electric power grid for which measurement data is at least currently unavailable. The mapping is made on the basis of the first set of measurement data and correlation between electrical characteristics of the first location and the second location.

The electric parameter may be the fault level. Other electric parameters, such as the grid frequency, phase angle, reactive power, harmonics, etc. may equally be computed by using the correlation, depending on the type of the measurement data available. In addition to the measurement data, further input data may be used to build the correlation, e.g. weather, temperature, usage, pricing tariffs, behaviors, traffic flows. If only fault level measurement data is available, the correlation may define correlation of the fault level amongst multiple locations of the electric power grid, and the mapped electric parameter may comprise or even consist of the fault level. If multiple types of measurement data are available and measured by the measurement devices, the processing system may compute a single correlation model incorporating the different types of measurement data under a single correlation model, or the processing system may form a dedicated correlation model for each type of measurement data, e.g. the fault level, the grid frequency, etc. If the available measurement data includes low-level measurement data such as the measured voltage and current values, the processing system may compute various higher-level electric parameters from the low-level measurement data, e.g. the fault level, and form the corresponding correlation model(s).

The embodiments of FIGS. 2 and 3 enable determination of the electric parameter on a grid network level and not only at the individual measurement points where the measurement devices are provided. In other words, the embodiments provide a wider perspective on the status of the electric power grid. The correlation model may be constructed on the basis of the measurements on the network level, e.g. to encompass the whole distribution network or a sub-network thereof. The correlation model may thus cover a wider area of the electric power grid than that formed by an effective area covered by a single measurement device. A single measurement may provide the electric parameter directly to the measurement location and an area around that location that is within an effective area of that location. As the distance to the measurement location increases, reliability of such an individual measurement degrades quickly. The correlation model built on the basis of multiple measurements performed at different locations of the electric grid enables interpolation of the electric parameter(s) even to those locations that are not within the direct effective areas of the individual measurement locations.

The correlation model may be built based on measurements carried out substantially simultaneously to provide a snap-shot of the state of the electric power grid. In another embodiment, the correlation model is updated as new measurement data is acquired, thus providing a constantly updating overall view of the electric power grid.

In another embodiment, the physical stimulus or stimuli intentionally generated to the electric power grid comprises an electrical stimulus. The electrical stimulus may cause an electric disturbance to the electric power grid that enables measurement and the estimation of the electric parameter such as the fault level.

Figure 4:
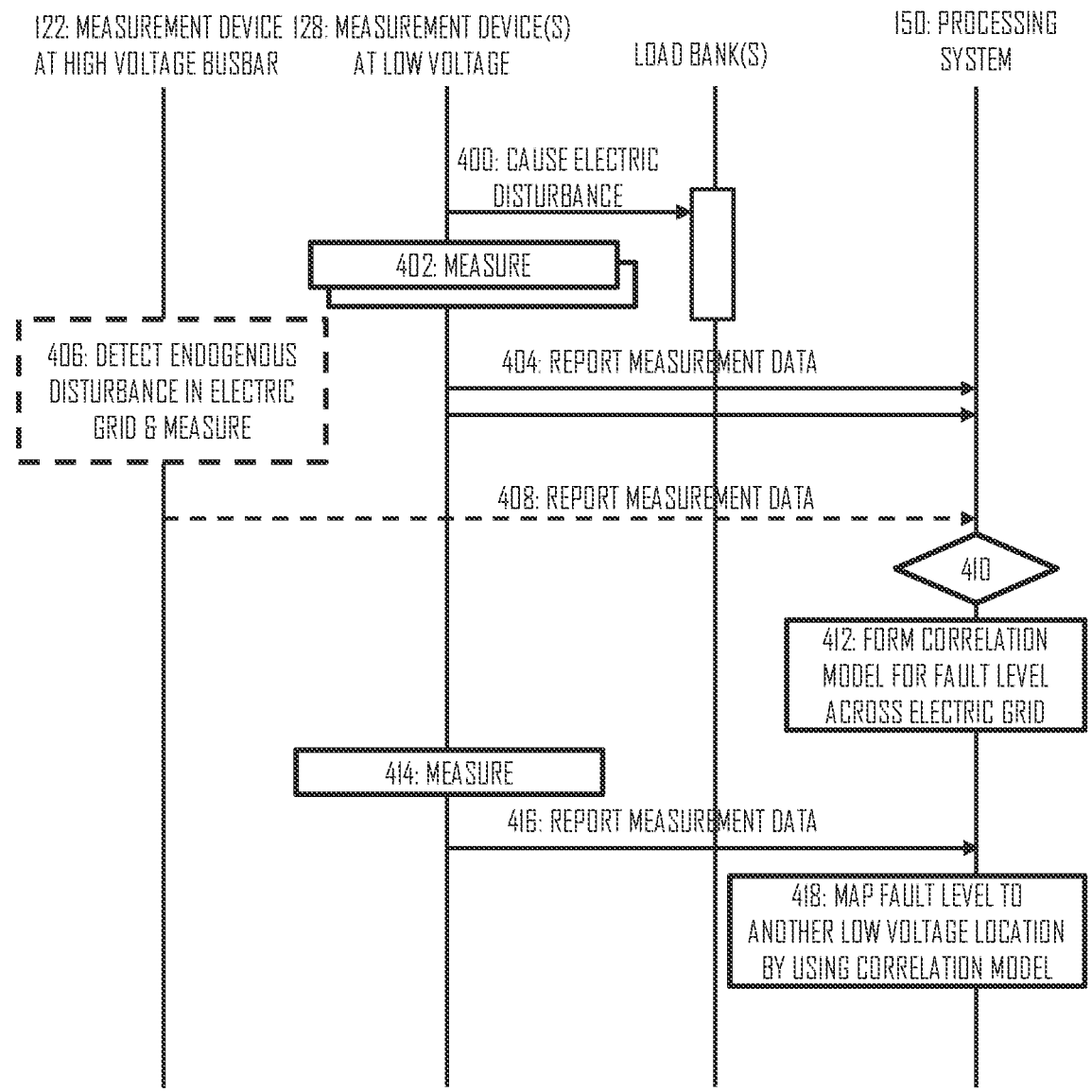
FIGS. 4 to 6 illustrate signalling diagrams for acquiring measurement data and mapping the measurement data across the electric power grid by using a correlation model according to some embodiments of the invention.
Figure 5:
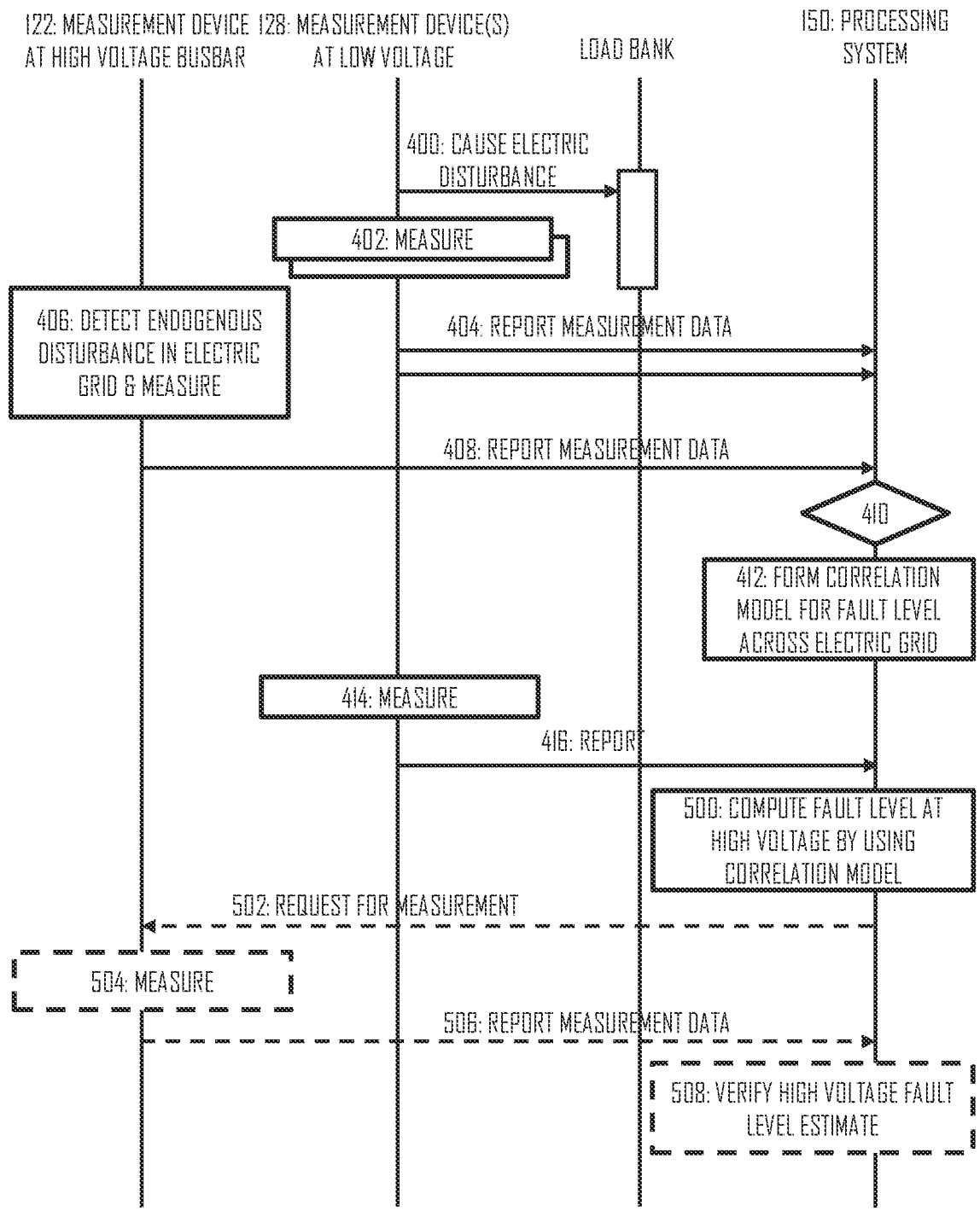
Figure 6:
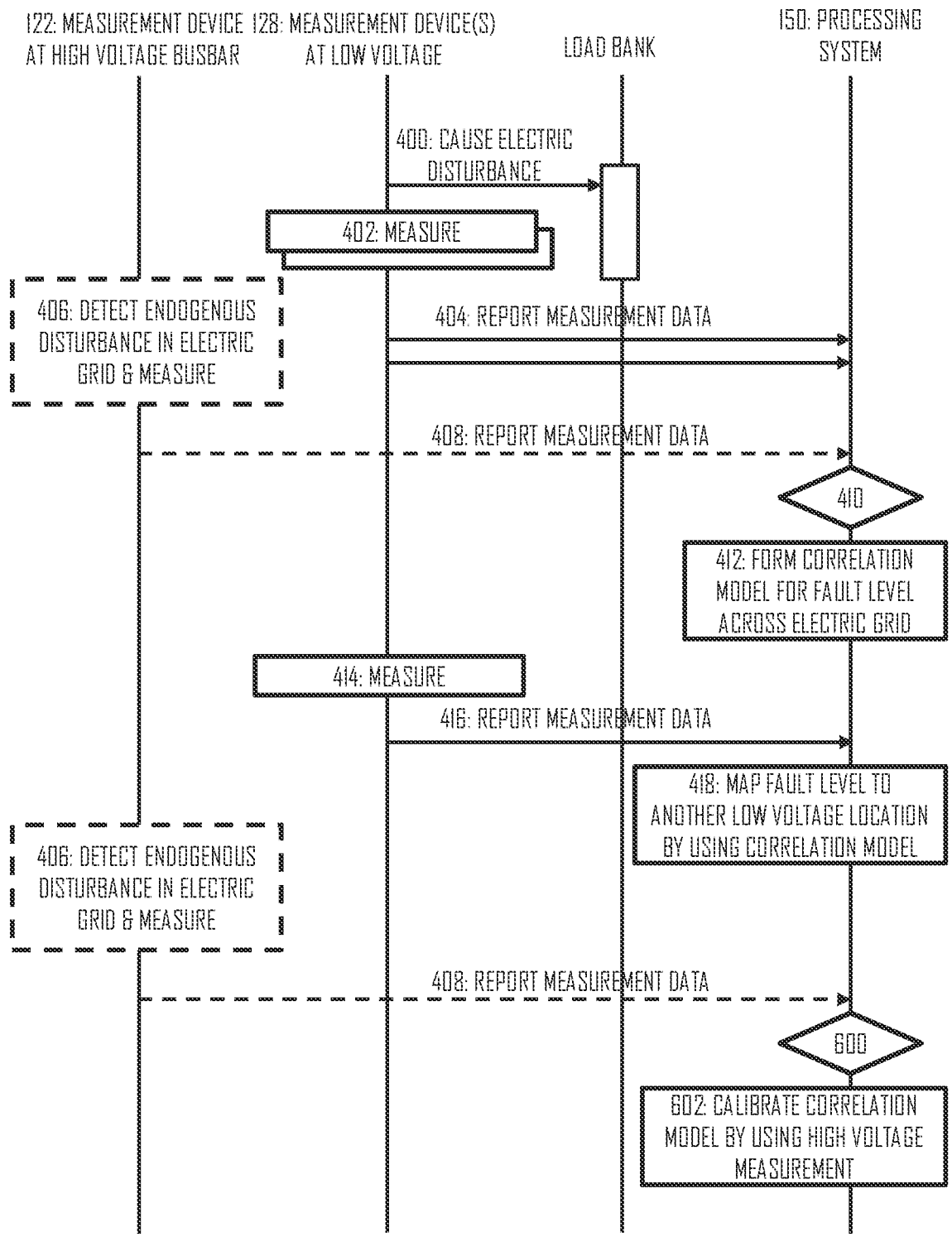

FIGS. 4 to 6 illustrate some embodiments for gathering the measurement data for the correlation and subsequent mapping of the electric parameter to a location different from the one from which measurement data has been acquired.

FIG. 4 illustrates a signaling diagram of an embodiment where the measurement data is measured on one voltage level of the electric power grid, and the electric parameter determined on the basis of the measurement data is mapped to an electric parameter of another location on the same voltage level of the electric power grid. Referring to FIG. 4, the measurement device(s) on the low voltage level, e.g. on the 230V or 11 kV, trigger one or more physical stimuli to one or more locations of the measurement device(s) in step 400. The one or more physical stimuli may be caused by connection/disconnection of one or more load banks 144 with respect to the electric power grid, or by changing power supply and/or power consumption of one or more devices, with respect to the electric power grid, thus causing the electric disturbance to the electric power grid. The electric disturbance may have an effective duration illustrated in FIG. 4 by a box in connection with the load bank(s). While the disturbance is in effect, the measurement data may be acquired by the measurement device(s) under the effective area of the disturbance (step 402). Step 402 may comprise measuring the fault level or measuring parameters that enable computation of the fault level, or another electric parameter of the electric power grid, e.g. the voltage and current in the electric power grid. Upon performing the measurements, the measurement device(s) may report the measurement data to the processing system 150 in step 404. Such a measurement report may be provided in the form of a Comtrade or other similar data file formats, for example.

From a further perspective, the measurements performed in step 402 are called active measurements because of the intentionally generated electric disturbance to carry out the measurement(s). As illustrated in FIG. 4, multiple measurements may be performed under the influence of the electric disturbance. Multiple electric disturbances may also be generated as well, at different locations on the low-voltage level of the electric power grid. The triggering of the disturbances may be synchronous such that the disturbances may occur substantially simultaneously at the different locations. The synchronization may be realized by using a common time reference such a Global Positioning System clock. The synchronous disturbances implicitly cause synchronous measurements at the different locations (or a subset thereof) in step 402. This enables a snapshot of the electric state of the low-voltage level of the entirety of or a large area of the electric power grid. Accordingly, the correlation model may be made more accurate thanks to the synchronous measurements.

In an optional embodiment, the measurement device 122 at the high voltage level may also carry out measurements (step 406). Upon detecting said endogenous disturbance in the electric power grid, the measurement device 122 may measure the electric power grid at the location of the measurement device 122 and gather further measurement data. The measurement device 122 may employ passive measurements in the sense that the electric disturbance has not been actively generated but, instead, is endogenous to the electric power grid. Block 406 may further comprise, before carrying out the measurement, verifying that the detected electric disturbance is eligible to the measurements. The verification may include, for example, verifying that the strength of the disturbance is high enough to carry out accurate measurements. This may be verified by comparing the detected disturbance, e.g. voltage and/or current fluctuation caused by the disturbance, with one or more thresholds. Additionally or alternatively, the verification may include verifying whether or not the disturbance is proximal to the location of the measurement device 122. The proximity may be evaluated by analyzing a waveform of a signal acquired from the electric power grid and comprising the disturbance. If the signal comprises a step function, the disturbance may be determined to be proximal to the location of the measurement device, and the measurement may be triggered. On the other hand, if the signal comprises an exponential waveform, the disturbance may be determined to be distant to the measurement device and the measurement is not triggered. Impedances of the electric grid deform the waveform of the electric signal being measured from the step function towards the exponential function as a distance from the location of the disturbance.

In step 408, the measurement device 122 reports the further measurement data to the processing system, e.g. in the form of a Comtrade or other similar data file formats. It should be appreciated that in some embodiments the measurement devices 122 to 129 may gather the measurement data over multiple disturbances and report the accumulated measurement data in a bundle.

If the measurement device 122 on the high-voltage level is capable of detecting the intentionally generated disturbance, it may carry out the measurement during the influence of the intentionally generated disturbance as well. This may provide the advantage of synchronous measurements over multiple voltage levels, as described below.

Figure 7:
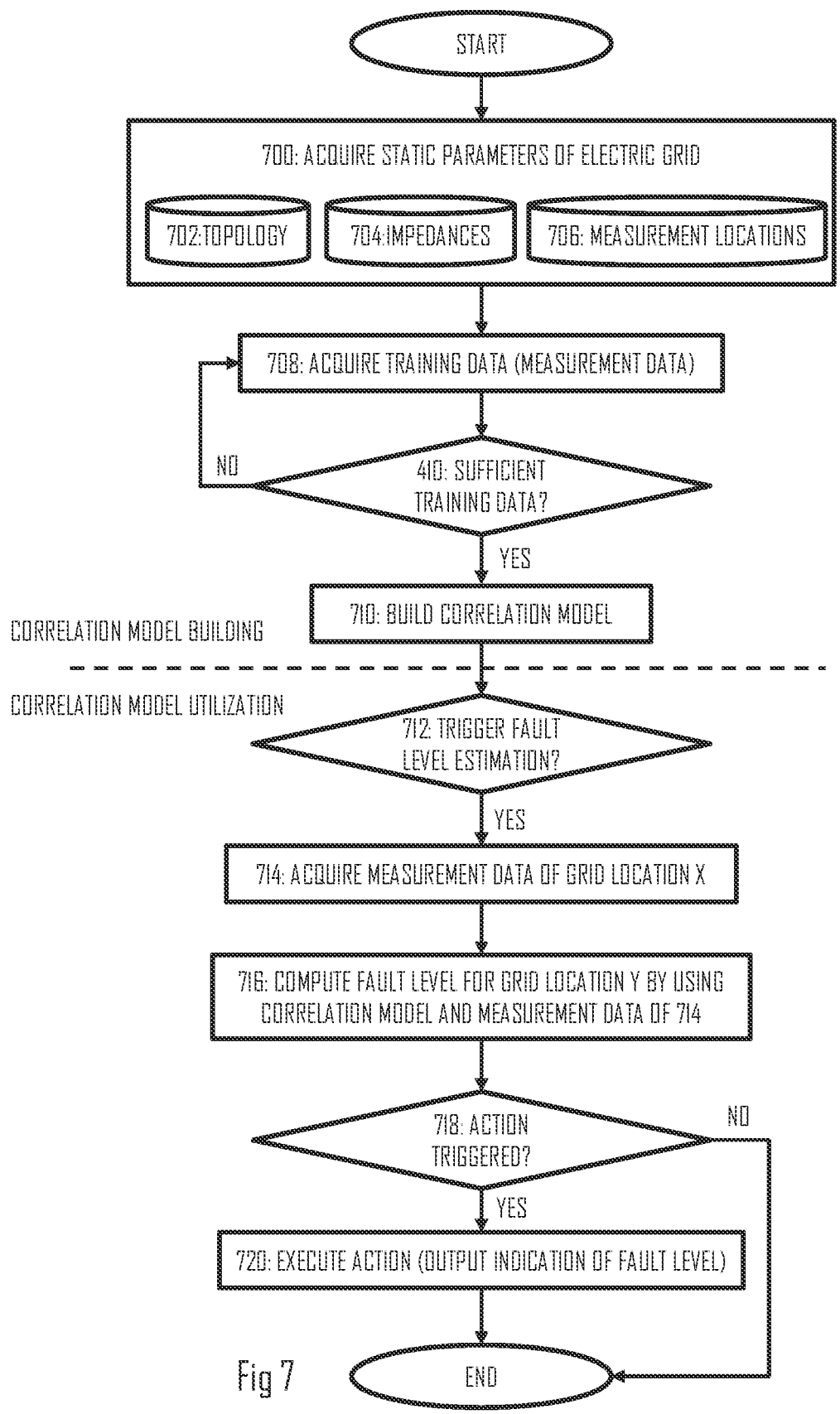
FIG. 7 illustrates a flow diagram of a computer-implemented process for generating and utilising the correlation model according to some embodiments of the invention.

Upon receiving at least some measurement data from the measurement devices, the processing system may determine in block 410 whether a sufficient amount of measurement data has been acquired to generate the correlation model. A parameter for block 410 may be a number of different measurement devices that have reported the measurement data. If a sufficient number of measurement devices have reported the measurement data, it may be determined the sufficient amount of measurement data is available. If the sufficient amount of measurement data is not available, the processing system 150 may wait for further measurement data. If the sufficient amount of measurement data is available, the processing system 150 may proceed to block 412 where the correlation model is built. FIG. 7 illustrates an embodiment of a procedure for forming the correlation model on the basis of at least the measurement data. Further input(s) such as static characteristics of the electric power grid may be used when forming the correlation model, as described below.

As described above, the correlation model may represent the electric parameter(s) of the electric power grid across the whole electric power grid at least on the voltage level(s) on which the measurements have been made. Alternatively, the correlation model may represent the electric parameter(s) of the electric power grid across a substantial area of the electric power grid, wherein the substantial area is wider than an aggregated area of the individual measurement locations.

Upon building the correlation model, the processing system may estimate the electric parameter at any part of the effective area of the correlation model. The processing system may, for example, form a map or a landscape of the electric parameter over the effective area by using the correlation model. The processing system may also generate a displayable visualization of the electric parameter at the various locations and voltage levels in the electric power grid and output the visualization for display to an operator of the processing system. The landscape may provide values of the electric parameter at various locations of the electric power grid, including locations where the real measurements have not been reported before executing block 412. The processing system may compare values of the electric parameter at the various locations with a threshold to determine whether or not any one of the various locations is susceptible to a malfunction. For example when the electric parameter comprises the fault level, the processing system 150 may determine whether or not any one of the various locations is susceptible to a fault level which triggers an action such as improvement countermeasures for countering an electric fault caused by a short circuit.

The correlation model also enables mapping of new measurement data, acquired from one measurement device located at one location of the electric power grid, to another location of the electric power grid from which the measurement data is currently unavailable or not up-to-date. Currently unavailable may be understood to refer to that there is no measurement device at the other location(s) of the electric power grid or that a measurement device at the other location(s) is not operational. It may also be understood to refer to a location where a measurement device is operational but provides erratic measurement data that is deemed unreliable, or the measurement device provides the measurement data so infrequently that the measurement data cannot be deemed to be up-to-date all the time. Referring back to FIG. 1, there may be no measurement device coupled to the local electric network of a building 132, a sub-station, or a sub-network of the electric power grid. However, performing measurements at another location, e.g. by the measurement device 126 and/or 128 enables computation of the fault level or another electric parameter at the local network of the house 132, by using the correlation model. Upon the measurement device measuring the measurement data in block 414 and reporting the new measurement data in step 416 to the processing system, the processing system receiving such new measurement data in step 416 may map an electric parameter computed from the new measurement data to another electric parameter of another location of the electric power grid (block 418). In this manner the correlation model enables an up-to-date estimation of the electric parameter to a location from where up-to-date measurement data is not available.

When measurement data measured at only the low-voltage level is available when executing block 412, the correlation model may enable estimation of the electric parameter only on the low-voltage level. However, the embodiment including steps 406 and 408 enables forming a correlation model that expands the correlation across multiple voltage levels. In an embodiment, the measurement data received on a first voltage level may be used to map the electric parameter to another location that is at a second voltage level different from the first voltage level. The first voltage level may be higher than the second voltage level, or the first voltage level may be lower than the second voltage level.

For example, block 418 would then enable estimation of the electric parameter on the high-voltage level also, e.g. at the location of the measurement device 122 or another part of the high-voltage level. If multiple measurements performed at multiple locations on the high-voltage level are received before block 412, the correlation model may enable estimation of the electric parameter at various locations on the high-voltage level in block 418, including locations where the direct measurement data has not been provided. FIG. 5 illustrates such an embodiment. In FIG. 5, the functions denoted by the same reference numbers as in FIG. 4 represent the same or substantially similar functions.

Referring to FIG. 5, steps 406 and 408 may be required in this embodiment to form the correlation model across the voltage levels. Upon forming the correlation model in block 412, the processing system 150 may estimate the electric parameter at any part of the effective area of the correlation model, including the low-voltage level and the high-voltage level and perform any one of the functions described above in connection with FIG. 4 on the high-voltage level. Upon receiving the new measurement data, e.g. from a measurement device on the low-voltage level in step 416, the processing system 150 may compute the electric parameter such as the fault level at one or more locations on the high-voltage level by using the correlation model (block 500).

In an embodiment, the real measurement data measured by a measurement device from the electric power grid and reported in step 416 may be replaced by the processing system 150 generating simulated measurement data associated with a location in the electric power grid. By using such artificially generated measurement data and the correlation model, the processing system may test various "what if"

scenarios that test the characteristics of the electric power grid. Therefore, the availability of real measurement data does not need to limit the process of FIG. 2, 3 or 4.

In an embodiment of FIG. 5, upon executing block 500 and computing the electric parameter of the high-voltage level on the basis of measurement data acquired on the low-voltage level, the processing system may verify the accuracy of the electric parameter by using an additional measurement performed on the high-voltage level. As a consequence, upon executing block 500, the processing system may compute the electric parameter again by using measurement data acquired from a measurement device 122 located on the high-voltage level. If such measurement data is not readily available or is not up-to-date, as determined by the processing system 150, the processing system 150 request (step 502) or wait for new measurement from the measurement device(s) 122 located at the high-voltage level. Upon the measurement device(s) 122 on the high-voltage level have performed the measurement(s) (step 504) and reported the measurement(s) (step 506), the processing system may verify the accuracy of the electric parameter (step 508).

The procedure of FIG. 5 may be generalized such that the verification process comprises verifying the computed electric parameter of the first location and/or said another location by using a further set of measurement data measured, upon detecting a further physical stimulus generated on the electric power grid, at a further location different from the first location and said another location. In other words, the electric parameter computed on the basis of measurement data measured at one voltage level may be verified by using further measurement data acquired from the same voltage level, e.g. the low-voltage level.

In an embodiment, if the electric parameter is determined not to be accurate, the processing system triggers calibration of the correlation model. Recalibration is described below in connection with FIG. 6. The processing system may discard the electric parameter computed in block 500 upon determining it inaccurate. Upon determining the electric parameter accurate, the processing system may determine that the correlation model is accurate and postpone the calibration. The processing system may also then trigger an action, if any triggered by the value of the electric parameter.

In an embodiment, measurement data is obtained intermittently or continuously according to occurrence of the one or more physical stimuli, intentionally generated and/or endogenous.

As described above, the high-voltage level measurements may be used for many purposes, of which one is calibration of the correlation model. In the electric power grid, the low voltage level may form a sub-network of the high-voltage level, as illustrated in FIG. 1. For example, the city network 115 forms a sub-network of the voltage level to which the measurement device 122 is coupled. Another sub-network may include the factory 130 and yet another sub-network or sub-networks may include renewable one or more power generators 137 and/or one or more renewable energy storage devices 136 that may include Statcom (static synchronous compensator) capabilities. The high-voltage level measurements may provide a holistic view of the electric parameter (s) of the sub-networks and, thus, provide a suitable reference for calibrating the correlation model.

In FIG. 6, the functions denoted by the same reference numbers as in previous Figures may represent the same or substantially similar functions. Referring to FIG. 6, after a determined time interval has passed from the creation of the correlation model or the latest calibration of the correlation model, or upon detecting an event triggering the recalibration of the correlation model, such as the inaccurate estimate of the electric parameter in step 500, the recalibration may be triggered (block 600). One trigger may be reception of new measurement data from the high-voltage level (step 408).

Upon triggering the calibration of the correlation model in block 600, the correlation model may be calibrated in block 602 by using the latest measurement data available from at least the high-voltage level. In block 602, the processing system 150 may additionally use the latest measurement data available from the low-voltage level, e.g. the measurement data acquired in step 416. In this manner, the correlation model may be kept up-to-date.

FIG. 7 illustrates an embodiment of a process executed by the processing system. The process of FIG. 7 may be logically divided into a correlation model building process and correlation model utilization process, and they may be mutually independent processes. Therefore, it should be appreciated that either one of the sub-processes may be carried out independently of the other. However, a combination of the sub-processes is a possible embodiment.

Referring to FIG. 7, the processing system 150 may first acquire static parameters of the electric power grid (block 700). Such static parameters may include a topology 702 of the electric power grid, defined in terms of interconnections of elements of the electric power grid. FIG. 1 illustrates one topology of the electric power grid. The topology 702 may thus represent the structure of the electric power grid or a subset thereof, depending on the intended coverage of the correlation model. The static parameters may include impedances (704) at various locations of the electric power grid. The impedance values describe electric interrelations between the various parts of the electric power grid and, thus, may be utilized in the correlation model. The static parameters may include the measurement locations 706, i.e. the locations to which the measurement devices 120 to 129 are coupled. The static parameters may further include a network status and a power generation profile of the power supply system. The network status may describe a state of power lines, transformers, load(s), and/or generator(s), for example. Additional static parameters may be provided, e.g. the locations and/or size(s) of the load banks 140 to 146, weather data, temperature data, solar irradiation data, pricing tariffs, market mechanisms and responses to those mechanisms, usage/consumption and generation models of the electric power grid, including for example traffic flows within the electric power grid. The static parameters may form one set of training data for forming the correlation model. The static parameters may comprise or be comprised in information on electric characteristics of the electric power grid.

In block 708, the processing system gathers another set of training data for forming the correlation model. This set of training data may comprise the measurement data measured from the electric power grid. The measurement data may comprise the above-described measurement data received by the processing system in steps 404 and/or 408, for example. As described above, the measurement data may include any one or more of a voltage, current, grid frequency, or above-described higher level measurement data.

As described above, the processing system may monitor (block 410) when a sufficient amount of training data has been gathered. Upon gathering the sufficient amount of training data, the process may proceed to block 710 where the correlation model is built by the processing system. Block 710 may comprise executing a machine learning algorithm using the above-described sets of training data as inputs for the machine learning. The machine learning algorithm may employ a neural network such as a deep neural network or a recursive neural network to form the correlation model. In general, the machine learning algorithm may search for patterns in the measurement data with the basic knowledge of the static parameters acquired in block 700. By analyzing the measurement data and the static parameters, the above-described correlation model within a voltage level and even across multiple voltage levels can be built.

When the correlation model has been built (block 710 completed), the correlation model may be used to map an electric parameter such as the fault level measured at one location to a corresponding electric parameter (such as the fault level) of another location from which the measurement data is not currently available or is out-of-date. The correlation model may also enable forecasting or predicting future behavior of the electric parameter at the location from which the measurement data is not currently available or is out-of-date, by using measurement data acquired from another location of the electric power grid. This may enable prediction of future development of the fault level, for example. An embodiment thus uses block 710 to compute the correlation model that represents the electric parameter such as the fault level during the measurements used as the basis for the correlation model. The measurements may have been carried out during a first time interval. The measurements may have been carried out within such a long time window that temporal behavior of the electric parameter may also be included in the correlation model. As a consequence, the correlation model may be used to estimate the electric parameter at a determined location of the electric power grid at a determined second time interval or a time instant that is in the future with respect to the measurements and/or with respect to the time of making the estimate.

The correlation model enables maintenance of the overall view of the electric power grid whenever measurement data from at least one location is received. The correlation model may map a single piece of measurement data received from a single measurement location to the overall view of the electric power grid. As a consequence, there is no need to provide the measurement devices at all locations where the electric parameter is needed. Furthermore, it is not necessary to receive the up-to-date measurement data from all the measurement locations as frequently. When the correlation model is accurate, the measurement data only from a single measurement location or a subset of the measurement locations is sufficient for the processing system to evaluate the electric parameter over the coverage area of the correlation model. As described above, the coverage area spans over multiple measurement locations and over multiple devices at the different locations of the electric power grid.

As described above, there are several implementations for determining the electric parameter at various locations of the electric power grid by using the correlation model that are now possible. In the embodiment described above, the landscape or the map of the electric parameter over the electric power grid may be formed by using the correlation model. The landscape/map may be computed by using the process of FIG. 7, for example as follows. The static input parameters may be used build a power system model for modelling the electric power grid, e.g. the impedances in the electric power grid, a power supply model, a power consumption model, the topology of the electric power grid, etc. Then, the electric parameter may be computed at various locations of the electric power grid by using the power system model. The various locations may include locations where the measurement device(s) are provided. Additionally, the electric parameter may be measured from the electric power grid by using the measurement device(s), as described above. The computed and the measured electric parameters may then be compared. If the computed and the measured electric parameters match in a sufficient manner, as determined in the comparison, it may be determined that the power system model is accurate and the electric parameter may be computed to other locations where the measurement device(s) have not been provided by using the power system model. If there is a discrepancy between the computed and the measured electric parameters, as indicated by the comparison, the power system model may be adjusted, e.g. by adjusting the impedance values used as the static input parameters. Thereafter, new computation and new measurement of the electric parameter may be carried out.

In yet another embodiment, the correlation model employs transfer impedances between a lower voltage level and a higher voltage level. In this embodiment, the (active) measurements on the lower voltage level may be used to estimate the electric parameter on the higher voltage level if the transfer impedance between the lower voltage level and the higher voltage level is known. In this embodiment, the passive measurements on a higher voltage level and based on the endogenous stimuli may be used to correct the transfer impedance and, thus the correlation model. Several lower voltage level measurement devices may be used to estimate the electric parameter on the higher voltage level to average measurement inaccuracies. The averaging may use simple averaging or a more sophisticated method of combining the measurements, e.g. a Kalman filter is a relevant example.

Upon triggering the estimation of the electric parameter, e.g. the fault level, in block 712, the measurement data measured at a grid location X is acquired in block 714. The estimation may be triggered by the completion or calibration of the correlation model, for example. Upon acquiring the measurement data, the electric parameter for various locations other than the location X is computed in block 716 by using the measurement data acquired in block 714 and the correlation model built in block 710. In block 718, it is determined whether the computation of the electric parameter for any one of the locations other than the location X triggers an action. The determination may be based on comparison of the electric parameter(s) associated with the other locations with one or more thresholds, e.g. a threshold fault level. If no action is triggered, the process may end. If an action is triggered in block 718, the process may proceed to block 720 where the action is triggered. The action may include output of a notification of a detected anomaly in the electric power grid, raising an alarm, etc.

In addition, or as an alternative, to using the correlation model to map the electric parameter between two real locations of the electric power grid, the correlation model may be used to estimate and/or predict the fault level in case the electric power grid is modified. For example, the correlation model may be used to evaluate effects of adding a new feeder bus or replacing a feeder bus or a sub-station. The procedure of FIG. 7 may change the static parameters such as the topology of the electric power grid and/or the impedance values to represent the modification and recompute the correlation model such that the change is accounted for.

Figure 8:
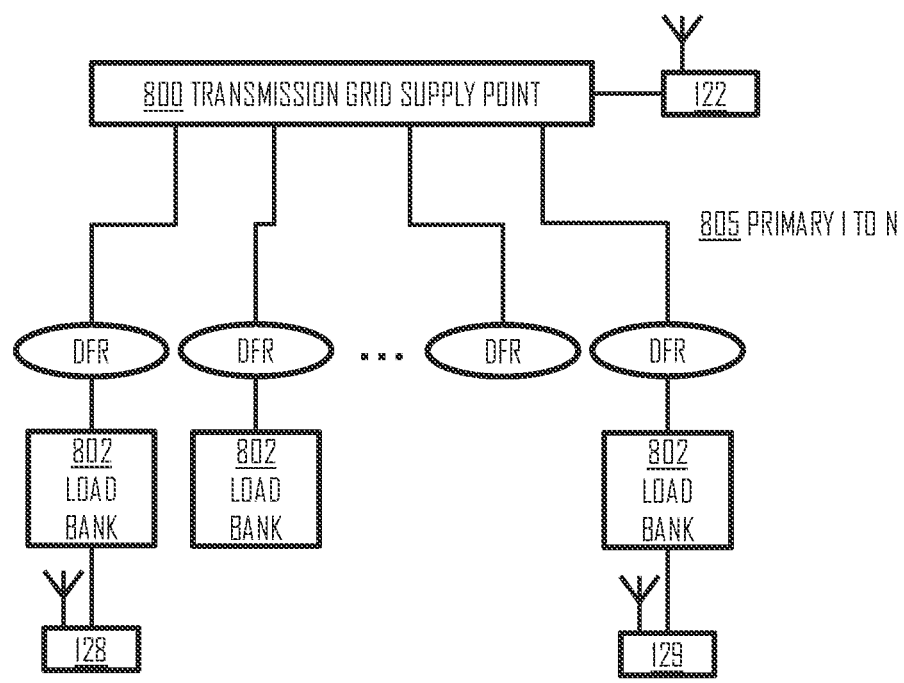
FIG. 8 illustrates a simplified diagram of an electric power grid and measurement points therein according to an embodiment of the invention.

FIG. 8 illustrates a simplified structure of the electric power grid to which the measurement devices may be coupled. As described above, one measurement device 122 may be coupled to a higher voltage level, e.g. to a transmission grid supply point 800. Multiple primary buses 1 to N 805 may be coupled to the transmission grid supply point, and a digital fault recorder (DFR) or a similar measurement device may be coupled to each primary bus or a subset of the primary buses 1 to N. The DFR is an example of the above-described measurement devices 120 to 129. In an embodiment, the DFR is configured to carry out the measurements based on the endogenous stimuli detected in the electric power grid. The DFRs may all be provided in the same unit of the electric power grid, e.g. a substation, but each DFR may be connected to a different primary bus, thus being connected to different points in the electric power grid. In other embodiments, the DFRs are provided in multiple units, e.g. different sub-stations, thus providing a broader overview of the fault level in the electric power grid or a sub-network of the electric power grid. Load banks 802 or similar devices used for generating the intentional disturbances may be coupled to the primary buses or a subset thereof, as illustrated in FIG. 8, and a measurement device 128, 129 may be coupled to a location of each load bank 802 or a subset of the load banks 802. As illustrated in FIG. 8, the measurement data may be provided on various voltage levels, three in this embodiment. The measurement device 122 carries out the (passive) measurement on the highest voltage level, the DFRs carry out the (passive) measurements on a lower voltage level, and the measurement devices 128, 129 carry out the (active) measurements on the lowest voltage level.

From a perspective of selecting the measurement method between the active and passive measurements, the active measurements using the load banks or otherwise actively generating the stimuli may be used on lower voltage levels where the active generation of the stimuli is more feasible in terms of complexity of the stimuli generation. On the lower voltage level, a smaller load bank is needed to generate a stimulus. On the higher voltage levels, the passive measurement method may be more efficient in terms of complexity, although active measurements may be technically possible as well with the use of disturbance generating devices being more complex or larger because of the requirements induced by the higher voltage level.

According to the principles described above, the electric parameter may be computed to even a primary bus not including any measurement device by using the measurement data acquired from another primary bus. Further according to the principles described above, the electric parameter for a primary bus on one voltage level may be estimated by using measurement data acquired on another voltage level of the particular primary bus or even on another voltage level or another primary bus. As the distance from the measurement location to the other location increases, the accuracy of the mapping/correlation also degrades. The accuracy from one voltage level to another through one voltage transformation may be sufficiently accurate, but the accuracy over yet another voltage level through another voltage transformation may be considered not accurate enough for some applications. In order to use active measurements on the lowest voltage level of FIG. 8 that have high correlation to the highest voltage level, the measurement device 121 of FIG. 1 and the load bank 141 may be used in connection with the transformer 113. Accordingly, the active measurements may be carried out on the low voltage level where the active measurements may be carried out efficiently, and still provide the active measurements that are only one hop (one transformer 113) away from the highest voltage level. As a result, accurate correlation of the measurement data even to the highest voltage level may be achieved by using the embodiment of FIG. 5, for example.

Figure 9:
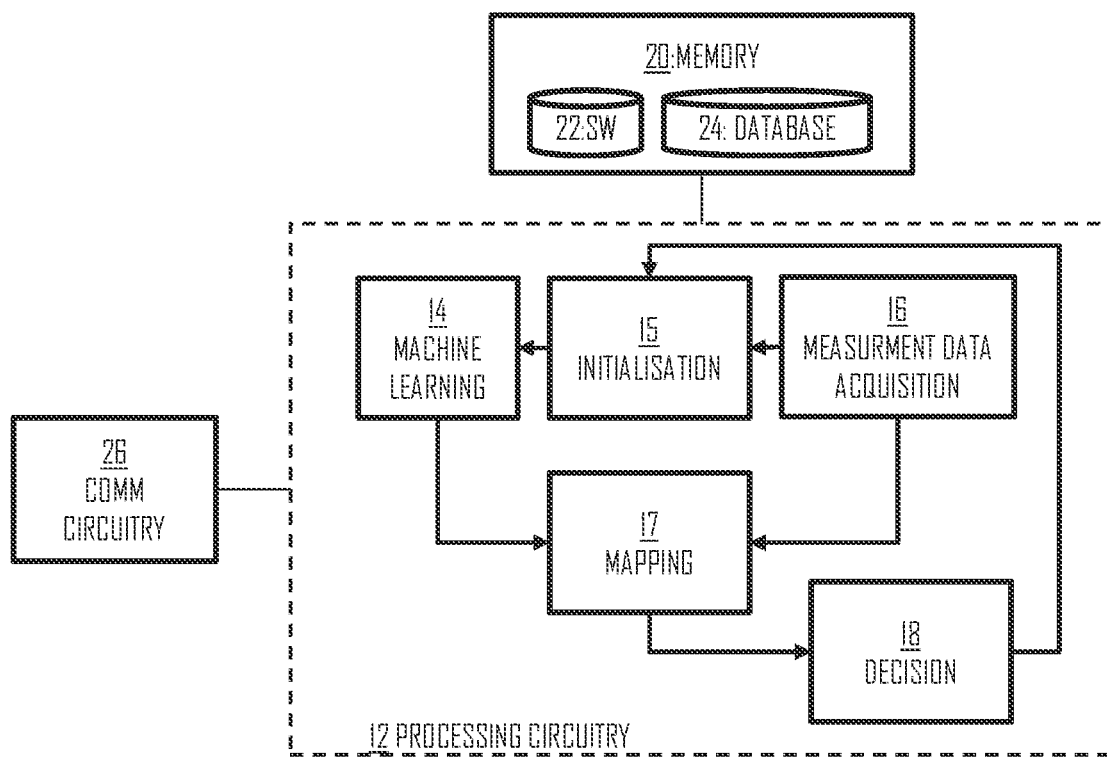
FIG. 9 illustrates a block diagram of an apparatus according to an embodiment of the invention.

FIG. 9 illustrates an embodiment of an apparatus configured to carry out at least some of the functions for estimating or predicting the fault level or another one or more of the electric parameters described herein by using the correlation model. The apparatus may comprise an electronic device comprising at least one processor or processing circuitry 12 and at least one memory 20. The apparatus may comprise a single computer or a computer system such as the cloud computing system described above. The apparatus may further comprise a communication circuitry 26 connected to the processing circuitry. The communication circuitry 26 may comprise hardware and software suitable for supporting one or more computer network protocols such as an Internet protocol (IP), Ethernet protocol, etc.

The memory 20 may store a computer program (software) 22 comprising computer program code defining the functions of the processing circuitry 12. The computer program code may, when read and executed by the processing circuitry 12, cause the processing circuitry to execute the process of FIG. 3, blocks 202 to 206 of FIG. 2, or any one of the embodiments as a computer-implemented process. The memory may further store a database 24 storing the correlation model, the acquired measurement data, and the static parameters of the electric power grid.

The processing circuitry 12 may comprise a measurement data acquisition circuitry 16 configured to acquire the measurement data from the measurement devices coupled to the electric power grid (steps 404, 408, 416, 506) and to store the measurement data in the database. Upon acquiring a sufficient amount of measurement data, the measurement data acquisition circuitry 16 may control an initialisation circuitry 15 to initialise a procedure for generating or calibrating the correlation model. The initialisation may comprise retrieval of the static parameters of the electric power grid (step 700) and the measurement data and input of the information to a machine learning circuitry 14. The static parameters may comprise internal parameters of the electric power grid such as impedances in the electric power grid, power supply/consumption profile, topology, etc. That static parameters may comprise parameters external to the electric power grid such as weather profile, pricing tariffs, solar irradiation patterns, etc. The machine learning circuitry 14 may then execute block 710 and form or update the correlation model. Upon completing the correlation model, the machine learning circuitry 14 stores the correlation model in the database. It may also notify a mapping circuitry 17 of the availability of the (updated) correlation model. The mapping circuitry 17 may then, upon receiving new measurement data from the measurement data acquisition circuitry 16, map an electric parameter computed from the measurement data to a corresponding electric parameter of another location or other locations in the electric power grid by using the correlation model, as described above. Upon computing the new electric parameters, the new electric parameters may be output to a decision circuitry 18 configured to execute blocks 718 and 720, for example. The decision circuitry 18 may also determine whether or not a recalibration of the correlation model is needed. If the calibration is needed, the decision circuitry may configure the initialisation circuitry 15 to initialise the calibration in a manner similar to that described above.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

Figure 10:
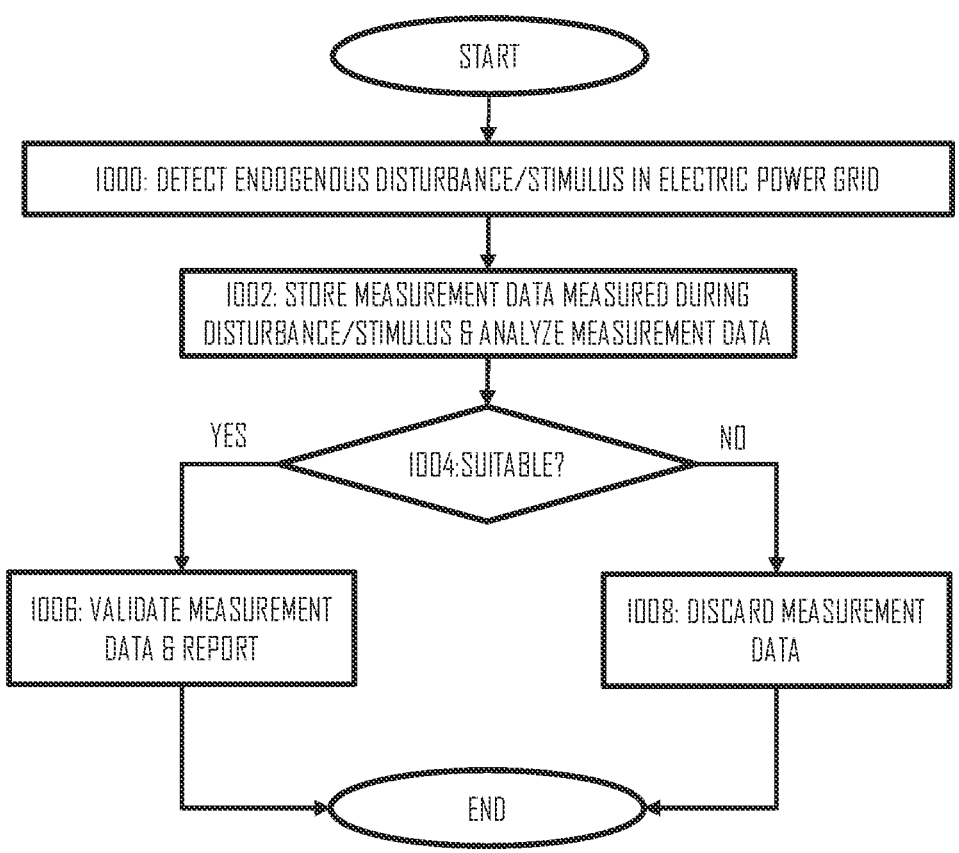
FIG. 10 illustrates a flow diagram of a verification procedure for validating measurement data measured during an endogenous disturbance in the electric power grid according to an embodiment.

As described above, in connection with measuring the endogenous electric stimulus in block 406, it may be first verified that the endogenous electric stimulus is suitable for measuring the electric parameter such as the fault level. Such a verification procedure may be used in connection with the other embodiments described above but it is not mandatory to use the verification only in connection with the correlation model. In fact, the verification procedure may be used for computing the electric parameter in general. FIG. 10 illustrates an embodiment of such a verification procedure for validating measurement data measured during an endogenous disturbance in the electric power grid. Referring to FIG. 10, the procedure comprises: detecting (block 1000) an endogenous disturbance in the electric power grid; measuring and storing one or more electric characteristics of the electric power grid during the disturbance or while the disturbance is effective (block 1002), thus acquiring measurement data; analyzing the measurement data (block 1002); and if the analysis in block 1002 indicates that the measurement data is suitable for estimating the electric parameter such as the fault level, the measurement data is validated in block 1006 and forwarded to further processing such as reporting the measurement data to the processing system 150. On the other hand, if the measurement data is determined to be unsuitable, the measurement data may be discarded in block 1008.

In an embodiment, the measurement data is stored in a Comtrade or another data format file storing voltage and/or current samples, and the analysis is performed on the contents of the Comtrade or said other data format file.

In an embodiment, the analysis in blocks 1002 and 1004 includes verifying that the strength of the disturbance is high enough to carry out accurate measurements. This may be verified by comparing the detected disturbance, e.g. voltage and/or current fluctuation caused by the disturbance, with one or more thresholds.

In an embodiment, the analysis includes verifying whether or not the disturbance is proximal to the location of the measurement device that detected and performs the procedure. The proximity may be evaluated by analyzing a waveform of a signal acquired from the electric power grid and comprising the disturbance. If the signal comprises a step function, the disturbance may be determined to be proximal to the location of the measurement device, and the measurement data may be validated in block 1006. On the other hand, if the signal comprises an exponential waveform, the disturbance may be determined to be distant to the measurement device and the measurement data is not validated (block 1008). As described above, impedances of the electric grid deform the waveform of the electric signal being measured from the step function towards the exponential function as a distance from the location of the disturbance.

In an embodiment, at least some of the processes described in connection with FIGS. 2 to 7 and 10 may be carried out by an apparatus comprising corresponding means for carrying out at least some of the described processes. Some example means for carrying out the processes may include at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry. In an embodiment, the at least one processor, the memory, and the computer program code form processing means or comprises one or more computer program code portions for carrying out one or more operations according to any one of the embodiments of FIGS. 2 to 7 and 10 or operations thereof.

According to yet another embodiment, the apparatus carrying out the embodiments comprises a circuitry including at least one processor and at least one memory including computer program code. When activated, the circuitry causes the apparatus to perform at least some of the functionalities according to any one of the embodiments of FIGS. 2 to 7 and 10, or operations thereof.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chip set (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments as described may also be carried out in the form of a computer process defined by a computer program or portions thereof. Embodiments of the methods described in connection with FIGS. 2 to 7 and 10 may be carried out by executing at least one portion of a computer program comprising corresponding instructions. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium, for example. Coding of software for carrying out the embodiments as shown and described is well within the scope of a person of ordinary skill in the art. In an embodiment, a computer-readable medium comprises said computer program.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

What is claimed is:

1. A method for monitoring an electric power grid, the method comprising:
    detecting one or more physical stimuli generated endogenously in the electric power grid, the physical stimuli belonging to nominal or near-nominal operation of the electric power grid and generating at least one of voltage fluctuation and current fluctuation that exceeds at least one threshold;
    obtaining, while the one or more physical stimuli is effective, a first set of measurement data associated with a first location of the electric power grid;
    computing a grid strength of the first location of the electric power grid on the basis of the first set of measurement data; and
    mapping the grid strength to a grid strength of a second location of the electric power grid on the basis of the first set of measurement data and correlation between electrical characteristics of the first location and the second location when measurement data from the second location is at least currently unavailable.

2. The method of claim 1, wherein measurement data from the second location is at least currently unavailable.

3. The method of claim 1, wherein the grid strength of the first location is computed by computing a source impedance at the first location on the basis of a voltage and a current measured at the first location before a physical stimulus of the one or more physical stimuli and a voltage and a current measured at the first location after the physical stimulus.

4. The method of claim 1, wherein the first location is at a first voltage level and the second location is at a second voltage level different from the first voltage level.

5. The method of claim 1, wherein the first location and the second location are both located on the same voltage level of the electric power grid.

6. The method of claim 1, further comprising forming, by using machine learning, the correlation by using, as training data, the first set of measurement data and at least a second set of measurement data associated with a second location of the electric power grid, the second set of measurement data measured while the one or more physical stimuli is effective, said machine learning further using, when forming the correlation, static internal parameters of the electric power grid and parameters external to the electric power grid.

7. The method of claim 6, wherein the static internal parameters of the electric power grid comprise the electric characteristics of the electric power grid between the first location and the second location.

8. The method of claim 1, further comprising verifying the computed electric parameter of at least one of the first location and the second location by using a further set of measurement data measured, upon detecting a further physical stimulus generated on the electric power grid, at a further location different from the first location and the second location.

9. The method of claim 1, further comprising:
    computing a correlation model representing the correlation between the electrical characteristics of the first location and the second location;
    determining before computing the correlation model, whether if not a sufficient amount of measurement data from at least a determined number of different measurement devices has been obtained;
    if the sufficient amount of measurement data is not available, waiting for further measurement data before computing the correlation model; and
    if the sufficient amount of measurement data is available, triggering said computation of the correlation model.

10. The method of claim 1, further comprising:
    determining whether or not the one or more physical stimuli are proximal to a location of a measurement device providing the first set of measurement data,
    upon determining that the one or more physical stimuli are proximal to the location of the measurement device, causing said obtaining the first set of measurement data, and
    upon determining that the one or more physical stimuli are not proximal to the location of the measurement device, measurements by the measurement device are not triggered.

11. The method of claim 10, wherein said determining is performed by analyzing a waveform of a signal acquired from the electric power grid and comprising the one or more physical stimuli.

12. The method of claim 1, further comprising:
    obtaining at least a second set of measurement data measured at a different time instant than the first set of measurement data;
    arranging the correlation model to represent temporal behavior of the grid strength in the electric power grid; and
    estimating future behavior of the grid strength by using the correlation model.

13. A system for monitoring a grid strength of an electric power grid, the system comprising:
    an apparatus comprising at least one processor and at least one memory including computer program code, the at least one memory and computer program code configured to, with the at least one processor, cause the apparatus to at least:
    obtain, on the basis of one or more physical stimuli generated endogenously in the electric power grid, a first set of measurement data associated with a first location of the electric power grid, the physical stimuli belonging to nominal or near-nominal operation of the electric power grid and generating at least one of voltage fluctuation and current fluctuation that exceeds at least one threshold;

compute a grid strength of the first location of the electric power grid on the basis of the first set of measurement data; and map the grid strength to a grid strength of a second location of the electric power grid on the basis of the first set of measurement data and correlation between electrical characteristics of the first location and the second location when measurement data from the second location is at least currently unavailable.

14. The system of claim 13, further comprising:

a first measurement device at the first location and configured to measure the first set of measurement data on a first voltage level of the electric power grid; and at least a second measurement device, at the second location or at a third location, on a second voltage level of the electric power grid different from the first voltage level and configured to provide further measurement data for the mapping.

15. The system of claim 14, wherein said at least the second measurement device is at the third location, and wherein the at least one memory and computer program code configured to, with the at least one processor, cause the apparatus to compute the grid strength of the second location on the basis of the first set of measurement data measured by the first measurement device and the further measurement data provided by said at least the second measurement device.

16. A computer program product embodied on a non-transitory distribution medium readable by a computer and comprising computer program instructions that, when executed by the computer cause execution of a computer process comprising:

obtaining, on a basis of one or more physical stimuli generated endogenously in the electric power grid, a first set of measurement data associated with a first location of the electric power grid, the physical stimuli belonging to nominal or near-nominal operation of the electric power grid and generating at least one of voltage fluctuation and current fluctuation that exceeds at least one threshold;

computing a grid strength of the first location of the electric power grid on the basis of the first set of measurement data; and mapping the grid strength to a grid strength of a second location of the electric power grid on the basis of the first set of measurement data and correlation between electrical characteristics of the first location and the second location when measurement data from the second location is at least currently unavailable.

17. The computer program product of claim 16, wherein:

a first measurement device at the first location is configured to measure the first set of measurement data on a first voltage level of the electric power grid; and at least a second measurement device, at the second location or at a third location, is on a second voltage level of the electric power grid different from the first voltage level and is configured to provide further measurement data for the mapping.

18. The computer program product of claim 17, wherein said at least the second measurement device is at the third location, and wherein the at least one memory and computer program code configured to, with the at least one processor, cause the apparatus to compute the grid strength of the second location on the basis of the first set of measurement data measured by the first measurement device and the further measurement data provided by said at least the second measurement device.

19. The computer program product of claim 16, wherein the computer process further comprises:

determining whether or not the one or more physical stimuli are proximal to a location of a measurement device providing the first set of measurement data, upon determining that the one or more physical stimuli are proximal to the location of the measurement device, causing said obtaining the first set of measurement data, and upon determining that the one or more physical stimuli are not proximal to the location of the measurement device, measurements by the measurement device are not triggered.

20. The computer program product of claim 19, wherein said determining is performed by analyzing a waveform of a signal acquired from the electric power grid and comprising the one or more physical stimuli.

* * * * *